United States Patent [19]

Watanabe et al.

[11] Patent Number: 5,202,305

[45] Date of Patent: Apr. 13, 1993

[54] SUPERCONDUCTING STRUCTURE FOR MAGNETIC SHIELDING

[75] Inventors: Keiichiro Watanabe, Nagoya; Hitoshi Yoshida, Okazaki; Hitoshi Sakai, Komaki; Shuichiro Oki, Aichi; Manabu Yoshida, Bisai, all of Japan

[73] Assignee: NGK Insulators, Ltd., Nagoya, Japan

[21] Appl. No.: 800,731

[22] Filed: Dec. 3, 1991

Related U.S. Application Data

[63] Continuation of Ser. No. 509,438, Apr. 16, 1990, abandoned.

[30] Foreign Application Priority Data

| Apr. 17, 1989 | [JP] | Japan | 1-97196 |
| Apr. 17, 1989 | [JP] | Japan | 1-97197 |
| May 15, 1989 | [JP] | Japan | 1-120686 |
| Jul. 12, 1989 | [JP] | Japan | 1-179662 |
| Mar. 2, 1990 | [JP] | Japan | 2-51518 |

[51] Int. Cl.[5] .................. H01L 39/12; B32B 15/04
[52] U.S. Cl. .................. 505/1; 428/632; 428/930; 505/701; 505/872
[58] Field of Search .................. 505/1, 700, 701, 872; 428/632, 930

[56] References Cited

U.S. PATENT DOCUMENTS

| H39 | 3/1986 | Gubser et al. | 505/872 |
| 3,331,041 | 7/1967 | Bogner | 505/872 |
| 3,895,156 | 7/1975 | Hammond | 428/216 |
| 4,908,348 | 3/1990 | Hurg et al. | 505/701 |
| 4,920,011 | 4/1990 | Ogawa et al. | 428/627 |
| 4,921,833 | 5/1990 | Takano | 505/701 |
| 4,942,142 | 7/1990 | Itozaki et al. | 505/702 |
| 4,994,435 | 2/1991 | Shiga et al. | 505/1 |
| 5,063,200 | 11/1991 | Okada et al. | 505/701 |
| 5,102,865 | 4/1992 | Woolf et al. | 505/701 |

FOREIGN PATENT DOCUMENTS

| 0254416 | 1/1988 | European Pat. Off. . |
| 0300499 | 1/1989 | European Pat. Off. . |
| 0301525 | 2/1989 | European Pat. Off. . |
| 2613115 | 9/1988 | France . |
| 2627005 | 8/1989 | France . |
| 63-245970 | 10/1988 | Japan | 505/700 |
| 63-279521 | 11/1988 | Japan | 505/701 |
| 63-292518 | 11/1988 | Japan | 505/700 |
| 63-300580 | 12/1988 | Japan | 505/700 |
| 64-06321 | 1/1989 | Japan | 505/700 |
| 64-44098 | 2/1989 | Japan | 505/701 |
| 64-52324 | 2/1989 | Japan | 505/701 |
| 1-220872 | 9/1989 | Japan . |
| 1-221810 | 9/1989 | Japan . |
| 2203909A | 10/1988 | United Kingdom . |
| 2214933A | 9/1989 | United Kingdom . |

OTHER PUBLICATIONS

Yin et al. "Magneteic Properties of Bismuth strontian calcium copper..." Modern Physics. Letters B, vol. 2, No. 9, pp. 1061-1066, Sep. 1988 Chem. Ab #110(6):49447e.

Hatta et al., "Diamagnetic properties of high to Bismuth ..." Japanese Journal of Applied Physics, Part 2, vol. 27, No. 5, pp. L855-6 chem. Ab #109(2):102889h, May 1988.

Applied Physics Letters, vol. 52, No. 19, May 9, 1988 "Superconductivity in the Bi-Sr-Ca-Cu-O compounds with noble metal additions".

Primary Examiner—George Wyszomierski
Attorney, Agent, or Firm—Shea & Gould

[57] ABSTRACT

The superconducting structure for magnetic shielding according to the present invention comprises at least two layers of a superconducting layer and a substrate. This superconducting structure for magnetic shielding can be formed in a plate-like shape or a cylindrical shape. When the structure is prepared in three-layers by providing an intermediate layer between the superconducting layer and the substrate, the three-layered structure has improved superconducting properties. When a protective layer is provided on the superconducting layer to protect the layer, the resulting structure has improved thermal shock resistance. The intermediate layer preferably consists of a ceramic or a noble metal and the ceramic preferably consists of a glass.

15 Claims, 2 Drawing Sheets

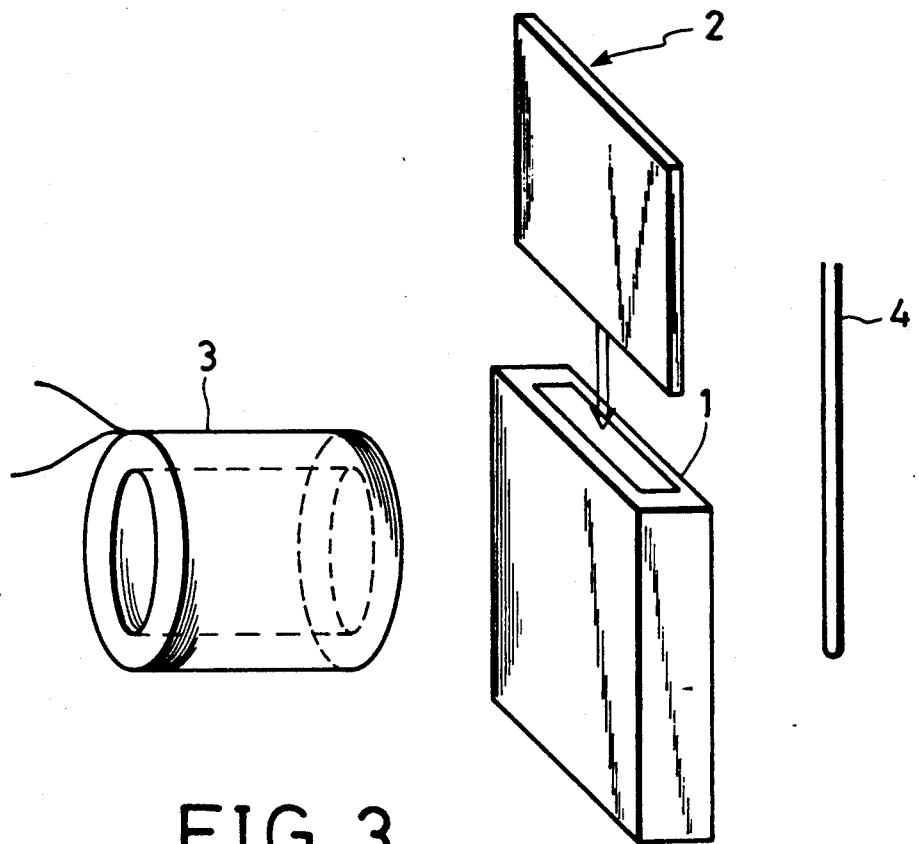
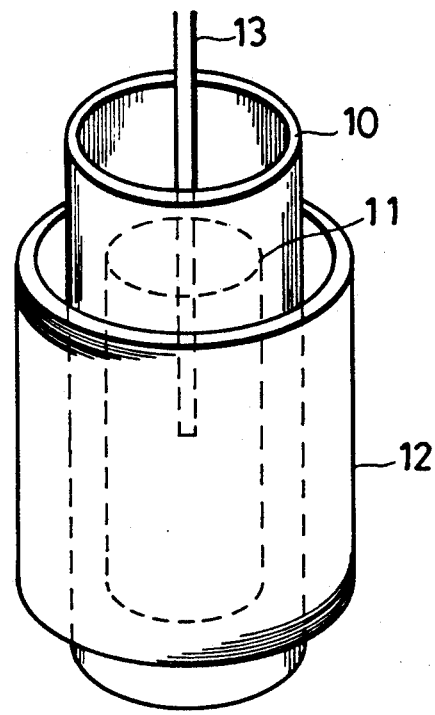

SUPERCONDUCTING STRUCTURE FOR MAGNETIC SHIELDING

This application is a continuation of application Ser. No. 509,438 filed Apr. 16, 1990, now abandoned.

BACKGROUND OF THE INVENTION AND RELATED ART STATEMENT

The present invention relates to a superconducting structure for magnetic shielding. More particularly, the present invention relates to a superconducting structure for magnetic shielding which can be suitably used for shielding of not only very low magnetic field such as geomagnetism or the like but also high magnetic field of levitated train, etc.

In recent years, by utilizing a superconducting magnet made of a superconducting material having superconducting properties, there have been practically used NMR tomographs, levitated trains, etc. Further, it is being investigated to apply the high magnetic field of superconducting magnet to development of new energy (e.g. nuclear fusion) or new energy conversion techniques (e.g. magnethydrodynamics power generation).

When there is used an apparatus utilizing a superconducting magnet, such as NMR tomograph or the like, leakage of magnetic field from the apparatus occurs in some cases, giving an adverse effect to the environment. Meanwhile in measurement of very low magnetic field such as biomagnetism ($a$-wave), the influence by external magnetic field such as geomagnetism or the like makes the measurement inaccurate.

In order to reduce the above problems, there is desired a magnetic shielding material capable of shielding an external magnetic field.

As the magnetic shielding material, there have conventionally been used soft magnetic materials having a high permeability and a low coercive force; however, these materials have too low shieldability in shielding a large magnetic force and may generate magnetism leakage in shielding low magnetic field. Therefore, in these materials, it is possible to make their volumes large to increase the shieldabilities, which in turn increases their weights.

Hence, the object of the present invention is to solve the problems of the conventional magnetic shielding materials and provide a superconducting structure for magnetic shielding which can be suitably used for shielding of not only very low magnetic field such as geomagnetism or the like but also high magnetic field of levitated train, etc.

The above object and other objects of the present invention will become apparent from the following description.

SUMMARY OF THE INVENTION

According to the present invention, there is provided a superconducting structure for magnetic shielding, comprising at least two layers of a superconducting layer and a substrate. This superconducting structure for magnetic shielding can be formed in a plate-like shape or in a cylindrical shape.

When in the above superconducting structure for magnetic shielding, there is provided an intermediate layer between the superconducting layer and the substrate, the resulting three-layered superconducting structure for magnetic shielding has an improved superconducting property, i.e. an improved critical current density.

When in the above superconducting structure for magnetic shielding comprising two layers of a superconducting layer and a substrate or three layers of a superconducting layer, an intermediate layer and a substrate, there is provided, outside the superconducting layer, a protective layer for protecting the superconducting layer, the resulting three-layered or four-layered superconducting structure for magnetic shielding has an improved thermal shock resistance, i.e. an improved low-temperature resistance.

The intermediate layer preferably comprises a ceramic layer or a noble metal layer, and the ceramic layer preferably comprises a glass, particularly a glass for porcelain enamel.

In the superconducting structure for magnetic shielding according to the present invention, it is preferably that the material for substrate and the material for superconducting layer be selected so that the substrate has about the same thermal expansion coefficient as the superconducting layer. Also in the three-layered or four-layered superconducting structure for magnetic shielding comprising a substrate, an intermediate layer and a superconducting layer or of a substrate, an intermediate layer, a superconducting layer and a protective layer, it is preferable that the material for substrate, the material for intermediate layer and the material for superconducting layer be selected so that the substrate and the intermediate layer have about the same thermal expansion coefficient as the superconducting layer.

Thus, it is preferable that the thermal expansion coefficients of the substrate, the intermediate layer and the superconducting layer be kept as mentioned above. "Having about the same thermal expansion coefficient" indicates that the thermal expansion coefficients of the substrate and the intermediate layer are within about $\pm 6 \times 10^{-6}/°$ C. relative to the thermal expansion coefficient of the superconducting layer.

BRIEF DESCRIPTION OF THE DRAWINGS

FIG. 1 is a schematic illustration showing an apparatus for measuring the magnetic shieldability of a plate-like structure.

FIG. 3 is a schematic illustration showing an apparatus for measuring the magnetic shieldability of a cylindrical structure.

DETAILED DESCRIPTION OF THE INVENTION

Figure 2:
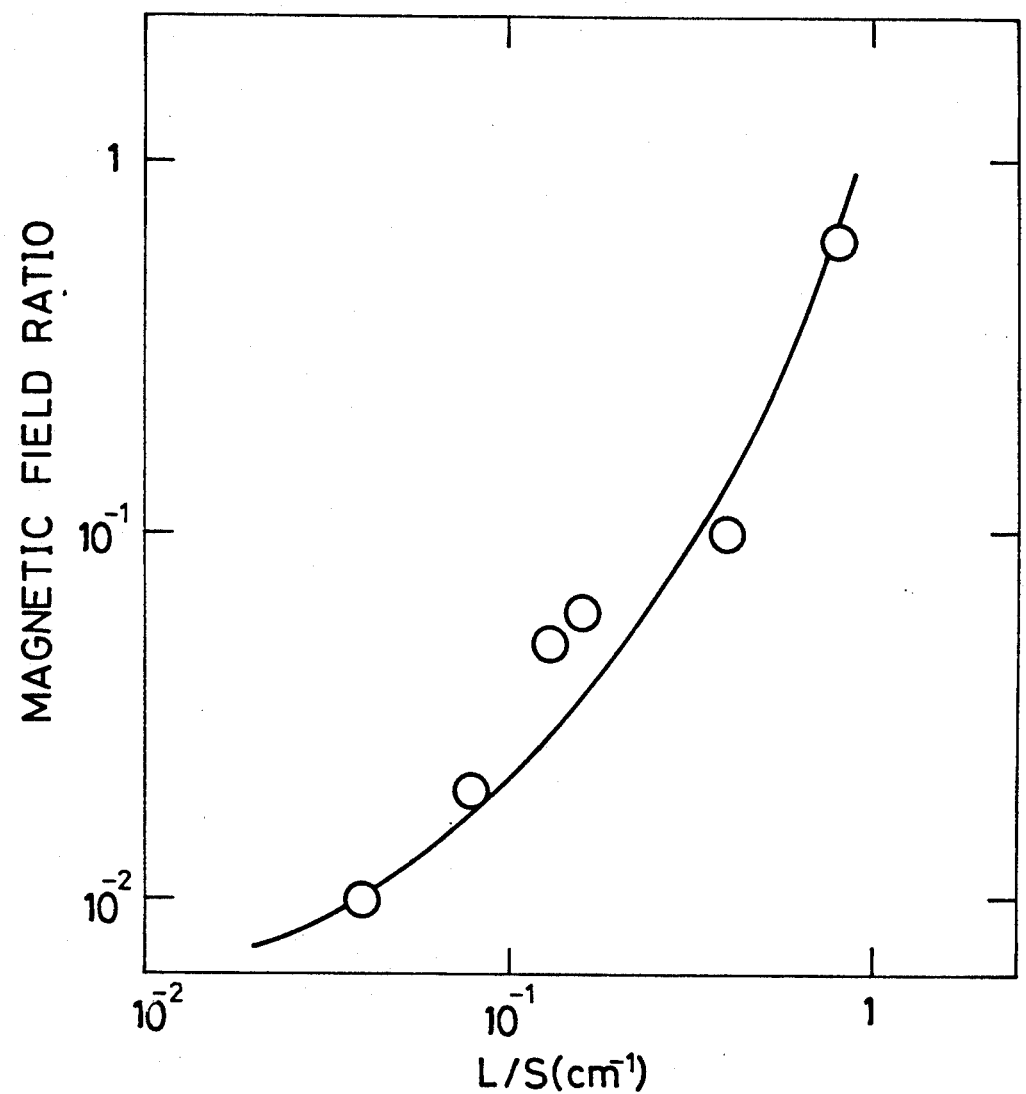
FIG. 2 is a graph shwoing a relationship of (a) a L/S ratio of a total length L (cm) of four sides of a magnetic shielding plate to an areas S (cm$^2$) of one side of the plate and (b) a magnetic field ratio which is defined later.

The type of the superconducting layer used in the present invention has no particular restriction. As typical examples of the superconducting layer, however, there can be mentioned a M-Ba-Cu-O type compound [M is at least one element selected from Sc,Tl, Y and lanthanide elements (La, Eu, Gd, Er, Yb, Lu, etc.] and a Bi-Sr-Ca-Cu-O type compound, both having a multi-layered perovskite structure. The superconducting layer comprising such a compound has a thermal expansion coefficient of about $13 \times 10^{-6}/°$ C. In this case, the Y-Ba-Cu-O type compound must have a crystal phase of $YBa_2Cu_3O_y$ composition and the Bi-Sr-Ca-Cu-O type compound must have a crystal phase of $Bi_2Sr$-

$_2CaCu_2O_x$. A Bi-Sr-Ca-Cu-O type compound is particularly preferable for magnetic shielding purpose.

The superconducting layer can be formed by spray coating or powder coating using a superconducting material powder or by molding a superconducting metal powder according to a doctor blade method and laminating the resulting molding (unfired) or the product obtained by firing the molding for expression of superconducting properties, onto a substrate or an intermediate layer provided on the substrate.

As the superconducting material powder, there can be mentioned (1) a powder of oxide superconducting composition obtained by firing powders of metal oxides, metal nitrides, metal carbonates, metal hydroxides and metal alkoxides each of Y, Sc, La, Cu, Ba, Bi, Sr, Ca, etc., (2) a powder whose main crystal phase consists of a superconducting oxide, obtained by calcination at 800°–950° C., (3) an intermediate product powder having superconducting properties, obtained by calcination at 400°–800° C. and subsequent firing and (4) an oxide frit powder having superconducting properties which is obtained by melting at elevated temperatures a powder of oxide superconducting composition obtained by firing, quenching and grinding the melt, and firing the resulting powder once more. The powders (1), (2), (3) and (4) can be used alone or in combination of two or more, or in combination of (1) and (2), (1) and (3), (2) and (3), (2) and (4) or (3) and (4), or in combination of (1), (2) and (3), (1), (2) and (4) or (2), (3) and (4), or in combination of (1), (2), (3) and (4).

The thickness of the superconducting layer is 0.1–2 mm, preferably 0.5–1 mm. When the thickness is smaller than 0.1 mm, the thickness is nonuniform and the supercurrent is small. When the thickness is larger than 2 mm, the adhesion of the superconductor to the substrate is poor and peeling tends to occur.

The substrate can use various materials such as metal, ceramic, glass and the like, as long as they have a given thermal expansion coefficient as mentioned above. Specifically, the metal material includes, for example, Fe, Ti, Be, Ni, stainless steel, Inconel, incoloy, Hastelloy and a steel plate with porcelain enamel. The ceramic material includes, for example, spinel, alumina, yttria, zirconia (partially stabilized zirconia and stabilized zirconia) and magnesia. The glass material includes, for example, various crystallized glasses.

The intermediate layer provided between the substrate and the superconducting layer can be made of various materials such as metal, ceramic, glass and the like. Specifically, the metal material includes, for example, noble metals (e.g. Au, Ag, Pt) and Ni. The ceramic material includes, for example, partially stabilized zirconia, stabilized zirconia, spinel, alumina, mullite, silicon carbide and magnesia. The glass material includes, for example, various crystallized glasses and glasses for porcelain enamel.

The intermediate layer preferably has no reactivity with the superconducting layer. When there is used an intermediate layer having reactivity with the superconducting layer, a two-layered structure is adopted, in which said intermediate layer having reactivity with the superconducting layer is provided adjacent to the substrate and another intermediate layer having no reactivity with the superconducting layer is provided adjacent to the superconducting layer.

In the present invention, it is preferable that the intermediate layer be constituted by a ceramic layer and a noble metal layer. The ceramic layer as a first intermediate layer is formed on the substrate. The types of ceramic are as mentioned above, but a glass of the type mentioned above is particularly preferable.

The preferable glass constituting the ceramic layer as a first intermediate layer has no particular restriction as long as it has a sufficiently large strength for adhesion to the substrate and the noble metal layer as a second intermediate layer. Such a glass includes a glass for porcelain enamel, and this glass is particularly desirable for use as the ceramic layer.

As the glass for porcelain enamel, there are typically mentioned, for example, a $SiO_2$-$BaO$-$B_2O_3$-$ZnO$ type composition used for heat-resistant steel or heat-resistant alloy, a heat-resistant porcelain enamel consisting mainly of a $SiO_2$-$BaO$-$TiO_2$ type composition, a porcelain enamel for steel consisting mainly of a $SiO_2$-$B_2O_3$-$Na_2O$-$Al_2O_3$-$K_2O$-$BaO$ type composition, and a glass for glass lining consisting mainly of a $SiO_2$-$B_2O_3$-$Na_2O$ type composition. To these glass compositions for porcelain enamel may be added various elements as long as the elements gives little adverse effect to the adhesion of ceramic layer to metal as well as to the melting point of the glass compositions.

The ceramic intermediate layer can be formed by various methods such as plasma spraying, gas spraying, spray coating, brush coating, dipping in slurry, sputtering and the like. Of these, spraying methods such as plasma spraying, gas spraying and the like are particularly preferable because the resulting ceramic layer has excellent adhesion to the metal substrate and can be formed as a relatively thick and stable intermediate layer.

The thickness of the ceramic intermediate layer can be 10 $\mu$m or more, preferably 10–500 $\mu$m, more preferably 20–200 $\mu$m. When the thickness is smaller than 10 $\mu$m, the ceramic layer has a nonuniform thickness, making it difficult to obtain good adhesion.

The noble metal layer as a second intermediate layer in the present invention is formed on the ceramic layer as a first intermediate layer provided on the substrate. As the noble metal constituting the noble metal layer of the present invention, there are used Ag, Au, Pd and Pt alone or in combination of two or more. As necessary, there may be used an alloy between such a noble metal and a base metal.

The noble metal layer can be formed on the ceramic layer by various methods such as coating of noble metal paste, plating, press bonding of metal foil, CVD, sputtering, decomposition of noble metal compound and the like. In this case, a heat treatment may be applied as necessary in, for example, the paste-coating method.

The thickness of the noble metal layer is 10–500 $\mu$m, preferably 20–200 $\mu$m. When the thickness is more than 500 $\mu$m, the effect of stabilizing the superconducting layer shows no further increase, leading to meaningless cost-up. When the thickness is smaller than 10 $\mu$m, the resulting superconducting layer is nonuniform, the adhesion between the ceramic intermediate layer and the noble metal intermediate layer is low, the noble metal layer is broken, and as a result the superconducting layer reacts with the ceramic layer at the interface with the substrate, making it difficult to obtain a good superconducting layer-substrate composite. Further, when the superconducting layer-substrate composite is used by cooling at a liquid nitrogen temperature, the thickness of the noble metal layer of less than 10 $\mu$m causes peeling between the noble metal layer and the ceramic layer due to their difference in thermal expansion, while the thickness of the noble metal layer of 10 μm or more gives a stable composite because the stress generated by said thermal expansion difference can be absorbed by the noble metal layer.

The protective layer for protecting the superconducting layer can be made of a material having an excellent thermal shock resistance (or low-temperature resistance). Therefore, the material for protective layer can be various, for example, a metal (e.g. Al), an organic material (e.g. low-temperature synthetic resin), a ceramic and a glass.

As described above, the superconducting structure for magnetic shielding according to the present invention is constituted by a substrate, a superconducting layer, preferably a protective layer provided outside the superconducting layer and further preferably an intermediate layer provided between the substrate and the superconducting layer.

The superconducting structure for magnetic shielding according to the present invention can be formed in a magnetic shielding plate or in a magnetic shielding cylinder. The magnetic shielding cylinder can be formed in two types, i.e. a type wherein the superconducting layer is positioned at the outside of the cylinder so as to shield a magnetic field from an external magnetic source and a type wherein the superconducting layer is provided at the inside of the cylinder so as to shield a magnetic field from an internal magnetic source.

In the magnetic shielding plate, the plate desirably has a L/S ratio of 0.4 cm$^{-1}$ or less when L (cm) is defined as the total length of sides of the plate and S (cm) is defined as the area of one surface of the plate, in order to minimize the magnetic field leakage from the joints of a large area magnetic shielding plate obtained by jointing.

The shape of the plate is preferably a regular hexagon or a regular square because such a shape can give a large area jointed plate for magnetic shielding without creating gaps at the joints. The regular hexagon or regular square, in particular, has a smaller L/S value than other shapes when compared on the same area basis, and can minimize magnetic field leakage.

In the magnetic shielding plate, it is desirable that the substrate be not covered by the superconducting layer at the four ends at a width of about 1 mm or more because such a structure (the area of the substrate is larger than that of the superconducting layer) can suppress the peeling of the superconducting layer and the formation of cracks.

Meanwhile in the magnetic shielding cylinder, it is desirable that the ratio of the length to the inside diameter be 1.5 or more because such a ratio can increase magnetic shielding at the cylinder center.

Further in the magnetic shielding cylinder, it is desirable that the superconducting layer is coated at the inside or outside of the substrate with the both ends of the substrate uncoated at a width of about 5 mm or more, preferably 10-50 mm because such coating can suppress the peeling of the superconducting layer and the formation of cracks.

Next, the process for producing the superconducting magnetic shielding structure of the present invention is explained on an example of a magnetic shielding plate comprising a substrate, a ceramic layer provided thereon, a noble metal layer provided on the ceramic layer and a superconducting layer provided on the noble metal layer.

A superconducting layer is formed on an intermediate layer consisting of a ceramic layer and a noble metal layer, provided on a substrate; then, drying and firing are effected; thereby, a magnetic shielding plate can be obtained which is a composite of a substrate, a two-layered intermediate layer (a ceramic layer and a noble metal layer) and a superconducting layer. In this case, when the formation of a superconducting layer is made by slurry coating or the like using an organic binder or an organic solvent, it is preferable that a heat treatment be conducted as a pretreatment for firing, that is, the coated superconducting layer be heat-treated at 500°-930° C. in an oxygen-containing atmosphere for a given length of time to reduce the carbon residue to 0.5% by weight or less.

In the present invention, the firing is effected in oxygen or air. The firing temperature and time can be determined appropriately depending upon the type of superconducting material used and the type of desired superconducting structure, but can be generally 850°-950° C. and about 0.5-20 hours.

The oxide superconducting laminate of the present invention has an integral structure obtained by forming a two-layered intermediate layer (a ceramic layer and a noble metal layer) on a metal substrate and forming an oxide superconducting layer on the intermediate layer. This two-layered intermediate layer consisting of a ceramic layer and a noble metal layer has a synergistic effect on both of the metal substrate and the oxide superconducting layer. Therefore, in the oxide superconducting laminate of the present invention, each layer on the metal substrate is stabilized, and causes no peeling or cracks when subjected to repeated use in liquid nitrogen for expression of superconducting properties. Further in the laminate, there occurs no reaction between the metal substrate and the superconducting material during the firing, irrespective of the type of the superconducting material. Furthermore, the laminate has higher superconducting properties than conventional laminate comprising a single intermediate layer. The reasons for these advantages are not clear but are presumed to be that the second intermediate layer (noble metal layer) diffuses into both of the first intermediate layer (ceramic layer) and the superconducting layer and thereby contributes to stabilization and improved superconducting properties.

The present invention is described in more detail below by way of Example. However, the present invention is in no way restricted to these Examples.

EXAMPLES 1-6 AND COMPARATIVE EXAMPLES 1-4

On the surface of a metal substrate having a thickness of 1 mm and a regular square shape of 120 mm in side length was spray-coated a powder whose crystal phase was composed mainly of $Bi_2Sr_2CaCu_2O_x$ so that the resulting film has a thickness of about 0.1-4 mm after drying and the metal substrate had an uncovered portion of 0-10 mm in width at the four sides (i.e. the length of one side of the film was 120-100 mm). Then the film was dried, followed by firing at 900° C. for 0.5 hour, to obtain various metal plates each comprising a metal substrate and a superconducting ceramic layer formed thereon whose crystal phase was composed mainly of $Bi_2Sr_2CaCu_2O_x$ and which had a thermal expansion coefficient of about $13 \times 10^{-6}$/° C.

As the metal substrate, there were used various materials from Kovar having a thermal expansion coefficient of $4.7\times10^{-6}/°$ C. to copper having a thermal expansion coefficient of $19.7\times10^{-6}/°$ C.

As shown in Table 1, peeling occurred in the case of Kovar having a thermal expansion coefficient of $4.7\times10^{-6}/°$ C.; good adhesion was obtained in the cases of titanium of $8.9\times10^{-6}/°$ C. to nickel of $13.3\times10^{-6}/°$ C.; peeling occurred in the cases of SUS 304 stainless steel of $18.7\times10^{-6}/°$ C. and copper of $19.7\times10^{-6}/°$ C.

In the cases of metal plates having good adhesion between the substrate and the superconducting ceramic layer, there were obtained magnetic shieldabilities of 5 G or more, as shown in Table 1.

When the distance from each end of substrate to corresponding end of superconducting layer, i.e. the width of the uncovered substrate portion was less than 1 mm, there occurred the peeling of superconducting ceramic layer from substrate.

TABLE 1

| | Material for substrate | Thermal expansion coefficient ($\times10^{-6}/°$C.) | Thickness of super conducting ceramic | Adhension between metal and super conducting | Critical current density (A/cm$^2$) | Magnetic shield ability (G) | L/S (cm$^{-1}$) | Width at ends* (mm) |
|---|---|---|---|---|---|---|---|---|
| Example 1 | Titanium | 8.9 | 0.7 | Good | 100 | 7 | 0.34 | 1 |
| Example 2 | Beryllium | 12.0 | 0.7 | Good | 200 | 14 | 0.34 | 2 |
| Example 3 | Iron | 12.1 | 0.7 | Good | 200 | 14 | 0.35 | 3 |
| Example 4 | Nickel | 13.3 | 0.5 | Good | 300 | 15 | 0.36 | 5 |
| Example 5 | Nickel | 13.3 | 1.5 | Good | 300 | 45 | 0.39 | 9 |
| Example 6 | SUS30 Stainless steel | 18.7 | 1 | Partially peeled | 50 | 5 | 0.36 | 5 |
| Comparative Example 1 | Kovar | 4.7 | 1 | peeled | 0 | 0 | — | 0 |
| Comparative Example 2 | Copper | 19.2 | 1 | peeled | 0 | 0 | — | 5 |
| Comparative Example 3 | Nickel | 13.3 | 0.1 | Good | 100 | 1 | 0.36 | 5 |
| Comparative Example 4 | Nickel | 13.3 | 3 | peeled | 0 | 0 | — | 0 |

*Width at ends indicates a distance from each end of substrate to the nearest to end of ceramic layer.

EXAMPLES 7-11 AND COMPARATIVE EXAMPLES 5-6

On the surface of a ceramic substrate having a thickness of 5 mm and a regular square shape of 120 mm in side length was spray-coated a powder whose crystal phase was composed mainly of $YBa_2CU_3O_y$ so that the resulting film had a thickness of about 1 mm after drying and the ceramic substrate had an uncovered portion of 5 mm in width at the four sides (i.e. the length of one side of the film was 110 mm). Then the film was dried, followed by firing at 950° C. for 10 hour, to obtain various ceramic plates each comprising a ceramic substrate and a superconducting ceramic layer formed thereon whose crystal phase was composed mainly of $YBa_2CU_3O_y$ and which had a thermal expansion coefficient of about $13\times10^{-6}/°$ C.

As the ceramic substrate, there were used various materials from zircon having a thermal expansion coefficient of $4.2\times10^{-6}/°$ C. to magnesia having a thermal expansion coefficient of $13.5\times10^{-6}/°$ C.

As shown in Table 2, peeling occured in the case of zircon having a thermal expansion coefficient of $4.2\times10^{-6}/°$ C.; good adhesion was obtained in the cases of alumina of $8.9\times10^{-6}/°$ C. to magnesia of $13.5\times10^{-6}/°$ C., and in these cases there were obtained magnetic shieldabilities of more than required.

TABLE 2

| | Material for substrate | Thermal expansion coefficient ($\times10^{-6}/°$C.) | Thickness of superconducting ceramic layer (mm) | Adhesion between metal and superconducting ceramic layer | Critical current density (A/cm$^2$) | Magnetic shield ability (G) | L/S (cm$^{-1}$) |
|---|---|---|---|---|---|---|---|
| Example 7 | Spinel | 7.6 | 0.7 | Partially peeled | 50 | 4 | 0.36 |
| Example 8 | Alumina | 8.8 | 0.7 | Good | 70 | 5 | 0.36 |
| Example 9 | Yttria | 9.3 | 0.7 | Good | 70 | 5 | 0.36 |
| Example 10 | Zirconia | 10.0 | 0.7 | Good | 70 | 5 | 0.36 |
| Example 11 | Magnesia | 13.5 | 1.5 | Good | 70 | 10 | 0.36 |
| Comparative Example 5 | Zircon | 4.2 | 1 | Peeled | 0 | 0 | — |
| Comparative Example 6 | Mullite | 5.3 | 1 | Peeled | 0 | 0 | — |

EXAMPLES 12-14

On the surface of a glass substrate having a thickness of 5 mm and a regular square shape of 120 mm in side length was spray-coated a powder whose crystal phase was composed mainly of $Bi_2Sr_2CaCu_2O_x$ so that the resulting film had a thickness of about 1 mm after drying and the glass substrate had an uncovered portion of 5 mm in width at the four sides (i.e. the length of one side of the film was 100 mm). Then the film was dried, followed by firing at 900° C. for 0.5 hour, to obtain various glass plates each comprising a glass substrate and a superconducting ceramic layer formed thereon whose crystal phase was composed mainly of $Bi_2Sr_2CaCu_2O_x$.

As the substrate glass, there were used crystallized glasses having thermal expansion coefficients of $13.5\times10^{-6}/°$ C. to $17.5\times10^{-6}/°$ C.

As shown in Table 3, good adhesion was obtained in all combinations of glass substrate and superconducting ceramic layer, and in all the combinations there were obtained magnetic shieldabilities of 5 G or more.

an intermediate layer formed thereon and a superconducting ceramic layer formed on the intermediate layer

TABLE 3

| | Material for substrate | Thermal expansion coefficient ($\times 10^{-6}/°C.$) | Thickness of superconducting ceramic layer (mm) | Adhesion between metal and superconducting ceramic layer | Critical current density (A/cm$^2$) | Magnetic shieldability (G) | L/S (cm$^{-1}$) |
|---|---|---|---|---|---|---|---|
| Example 12 | Li$_2$O—ZnO—SiO$_2$ crystallized glass A | 13.5 | 0.7 | Good | 300 | 21 | 0.36 |
| Example 13 | ZnO—Al$_2$O$_3$—SiO$_2$ crystallized glass | 15.8 | 0.7 | Good | 120 | 8 | 0.36 |
| Example 14 | Li$_2$O—ZnO—SiO$_2$ glass B | 17.5 | 0.7 | Good | 100 | 5 | 0.36 |

EXAMPLES 15-18

On a metal substrate was formed a superconducting ceramic layer of the same material as used in Example 1. On this superconducting ceramic layer was further formed a protective layer. The four plates thus formed were placed in liquid nitrogen to evaluate their thermal shock resistances.

As the protective layer, there was used a alumina or a low-temperature resistant synthetic resin.

As shown in Table 4, the both protective layers showed better thermal shock resistances than the superconducting ceramic layer having no protective layer thereon, in immersion-in-liquid-nitrogen test.

whose crystal phase was composed mainly of Bi$_2$Sr$_2$CaCu$_2$O$_x$.

As the substrate material, there was used titanium or nickel.

As shown in Table 5, all the intermediate layers showed good adhesion, and the critical current density characterizing superconductivity in liquid nitrogen was higher in all the cases than in Example 1 wherein no intermediate layer was formed.

The magnetic shielding plates prepared in Examples 1-14, 19-23 and Comparative Examples were measured for magnetic shieldability, using an apparatus for measurement of magnetic shieldability, shown in FIG. 1.

That is, a magnetic shielding plate 2 was placed in a

TABLE 4

| | Material for substrate | Thickness of superconducting ceramic layer (mm) | Material for protective layer | Thickness of protective layer (mm) | Immersion-in-liquid-nitrogen test |
|---|---|---|---|---|---|
| Example 15 | Iron | 0.7 | Aluminum | 0.1 | Good |
| Example 16 | Iron | 0.7 | Aluminum | 0.5 | Good |
| Example 17 | Iron | 0.7 | Synthetic resin | 0.2 | Good |
| Example 18 | Nickel | 0.7 | Synthetic resin | 0.1 | Good |
| Example 3 | Iron | 0.7 | — | — | Partially peeled |

EXAMPLES 19-23

On the surface of a metal substrate having a thickness of 1 mm and a regular square shape of 120 mm in side length was formed, as an intermediate layer, calcia-stabilized zirconia, platinum, nickel or a MgO.B$_2$O$_3$.-SiO$_2$ glass in the thickness of about 200 μm. On this intermediate layer was spray-coated, as a superconducting ceramic layer, a powder whose crystal phase was composed mainly of Bi$_2$Sr$_2$CaCu$_2$O$_x$ so that the resulting layer had a thickness of about 1 mm after drying and the four-side portion of the substrate was not coated at a width of 5 mm (the length of one side of the ceramic layer was 110 mm). Then the ceramic layer was dried, followed by firing at 900° C. for 0.5 hours, to obtain various metal plates each comprising a metal substrate, container 1 for liquid nitrogen; the container 1 was filled with liquid nitrogen; an external magnetic field was applied from an electromagnet 3; and using a Gauss meter 4 provided so as to face the electromagnet 3 via the container 1, there was measured a maximum external magnetic field (magnetic shieldability) at which the magnetic field began to exceed the background.

TABLE 5

| | Material for substrate | Material for intermediate layer | Thickness of intermediate layer (μm) | Porosity of intermediate layer (%) | Surface roughness of intermediate layer (Rz) | Thickness of superconducting ceramic layer (mm) | Critical current density (A/cm$^2$) | Magnetic shieldability (G) | L/S (cm$^{-1}$) |
|---|---|---|---|---|---|---|---|---|---|
| Example 19 | Titanium | Zirconia | 200 | 11 | 10 | 1 | 430 | 13 | 0.36 |
| Example 20 | Titanium | Zirconia | 500 | 15 | 20 | 2 | 150 | 20 | 0.36 |
| Example 21 | Titanium | Platinum | 10 | 0 | 3 | 1 | 140 | 14 | 0.36 |
| Example 22 | Iron | Nickel | 50 | 0 | 5 | 1 | 240 | 24 | 0.36 |
| Example 23 | Iron | MgO—B$_2$O$_3$—SiO$_2$ glass | 200 | 0 | 3 | 1 | 250 | 25 | 0.36 |

EXAMPLES 24-27 and 23'

In each of the metal plates comprising a metal substrate, an intermediate layer formed thereon and a superconducting ceramic layer formed on the intermediate layer, obtained in Examples 19-22, there was formed a protective layer on the superconducting ceramic layer. The resulting plates were placed in liquid nitrogen to evaluate their thermal shock resistances.

As the protective layer, there was used aluminum or a low-temperature resistant synthetic resin.

As shown in Table 6, all the protective layers showed better thermal shock resistances than the case having no protective layer, in the immersion-in-liquid-nitrogen test.

FIG. 2 is a graph showing the relationship of L/S and magnetic field ratio. As is clear from FIG. 2, when the L/S was less than 0.4 cm$^{-1}$, the applied magnetic field was reduced to 1/10 or less and there was obtained a sufficient magnetic shieldability.

EXAMPLES 35-38 AND COMPARATIVE EXAMPLES 8-9

TABLE 6

| | Material for substrate | Material for intermediate layer | Thickness of superconducting ceramic layer (mm) | Material for protective layer | Thickness of protective layer (mm) | Immersion-in-liquid-nitrogen test |
|---|---|---|---|---|---|---|
| Example 24 | Titanium | Zirconia | 1 | Aluminum | 0.1 | Good |
| Example 25 | Titanium | Zirconia | 2 | Aluminum | 0.5 | Good |
| Example 26 | Titanium | Platinum | 1 | Syn. resin | 0.2 | Good |
| Example 27 | Iron | Nickel | 1 | Syn. resin | 0.1 | Good |
| Example 23 | Iron | MgO—$B_2O_3$—$SiO_2$ glass | 1 | — | — | Partially peeled |

EXAMPLES 28-34 AND COMPARATIVE EXAMPLE 7

On various substrates made of various materials, having a thickness of 1-5 mm and a regular square or regular hexagon shape of different size was formed a superconducting ceramic layer to obtain various unit plates for magnetic shielding. A plurality of the same unit plates were combined to prepare various square panels for magnetic shielding each having a side length of 1 m. The panels were measured for magnetic shieldability.

As shown in Table 7, in the magnetic shielding panels whose L/S ratios [L (cm) was the total length of sides (i.e. peripheral length) of each unit plate constituting a magnetic shielding panel, and S (cm$^2$) was the surface area of one side of the unit plate] were 0.4 cm$^{-1}$ or less, the applied magnetic field was reduced to 1/10 or less and a sufficient magnetic shieldability was obtained.

On the outer surfaces of various cylindrical substrates made of various metals and having a thickness of 1-5 mm and various sizes was formed a superconducting ceramic layer to obtain cylindrical structures for magnetic shielding. The cylindrical structures were measured for magnetic shieldability.

As shown in Table 8, when the ratio of cylinder length to cylinder inner diameter was 1.5 or more, the magnetic field at the cylinder center was 1/100 or less of the applied magnetic field and there was obtained a sufficient magnetic shieldability.

Also, when the distance from each end of the cylindrical substrate to each corresponding end of the superconducting ceramic layer was 10 mm or more, there was no peeling or crack at the ends of the superlconducting ceramic layer and thereby magnetic leakage could be prevented.

TABLE 7

| | Material for substrate | Material for intermediate layer | Material for protective layer | Shape | Length of one side (mm) | L/S (cm$^{-1}$) | Number of unit plates used for formation of square panel of 1 m$^2$ | Magnetic field ratio* | Width at ends (mm) |
|---|---|---|---|---|---|---|---|---|---|
| Example 28 | Zirconia | — | — | Regular square | 100 | 0.40 | 100 | $1 \times 10^{-1}$ | 1 |
| Example 29 | Titanium | Zirconia | Synthetic resin | Regular square | 250 | 0.16 | 16 | $6 \times 10^{-2}$ | 2 |
| Example 30 | Carbonless steel | Silver | Aluminum | Regular square | 500 | 0.08 | 4 | $2 \times 10^{-2}$ | 5 |
| Example 31 | SUS304 | Zirconia | Aluminum | Regular square | 1000 | 0.04 | 1 | $1 \times 10^{-2}$ | 5 |
| Example 32 | SUS304 | Zirconia | Aluminum | Regular hexagon | 192 | 0.13 | 14 | $5 \times 10^{-2}$ | 5 |
| Example 33 | SUS304 | Zirconia | Aluminum | Regular hexagon | 289 | 0.08 | 7 | $2 \times 10^{-2}$ | 5 |
| Example 34 | SUS304 | Zirconia | Aluminum | Regular hexagon | 577 | 0.04 | 5 | $1 \times 10^{-2}$ | 5 |
| Comparative Example 7 | Zirconia | — | — | Regular square | 50 | 0.83 | 400 | $6 \times 10^{-1}$ | 1 |

*Ratio of reduced magnetic field to applied magnetic field when a magnetic field was applied to a square magnetic shielding panel of 1 m$^2$ from a point 50 cm apart from the center of one side of the panel and a reduced magnetic field was measured at a point 10 cm apart from the other side of the panel.

TABLE 8

| | Material for substrate | Material for intermediate layer | Material for protective layer | Inner diameter of cylinder (mm) | Length of cylinder (mm) | Length-to-inner diameter ratio | Magnetic field ratio at cylinder center*1 | Width at ends*2 (mm) | Condition of ends of superconducting ceramic layer |
|---|---|---|---|---|---|---|---|---|---|
| Example 35 | Zirconia | — | — | 100 | 200 | 2 | $4 \times 10^{-4}$ | 10 | No defect |
| Example 36 | $Li_2O$—ZnO—$SiO_2$ crystallized glass B | — | Aluminum | 100 | 300 | 2 | $1 \times 10^{-5}$ | 20 | No defect |
| Example 37 | Titanium | Zirconia | Synthetic resin | 1000 | 2000 | 2 | $4 \times 10^{-4}$ | 50 | No defect |
| Example 38 | Beryllium | Platinum | Aluminum | 1000 | 1500 | 1.5 | $3 \times 10^{-3}$ | 50 | No defect |
| Compar- | Zirconia | — | — | 100 | 100 | 1 | $10^{-1}$ | 0 | Peeling and |

TABLE 8-continued

|  | Material for substrate | Material for intermediate layer | Material for protective layer | Inner diameter of cylinder (mm) | Length of cylinder (mm) | Length-to-inner diameter ratio | Magnetic field ratio at cylinder center*1 | Width at ends*2 (mm) | Condition of ends of superconducting ceramic layer |
|---|---|---|---|---|---|---|---|---|---|
| ative Example 8 |  |  |  |  |  |  |  |  | cracks |
| Comparative Example 9 | Iron | MgO—B$_2$O$_3$—SiO$_2$ glass | Aluminum | 100 | 300 | 3 | $10^{-1}$ | 2 | Partially peeled |

*1 Ratio of magnetic field at cylinder center to applied magnetic field when an external magnetic field was applied to a cylinder from a direction perpendicular to the cylindrical axis.
*2 Distance from each end of cylindrical substrate to each corresponding end of superconducting ceramic layer.

EXAMPLE 39

The surface of a plate-like SUS 430 stainless steel substrate of 100 mm×100 mm×1.0 mm was sand blasted with alumina grinding particles. On the resulting roughened surface was plasma-sprayed a PSZ (partially stabilized zirconia) powder to form a PSZ intermediate layer of 200 μm. On this layer was coated a Ag paste, followed by drying (1 hour at 80° C.) and subsequent heat treatment (10 minutes at 940° C.) to form a Ag intermediate layer of about 30 μm to obtain a metal substrate having thereon two intermediate layers consisting of a PSZ layer and a Ag layer. Then, powders of Bi$_2$O$_3$, SrCO$_3$, CaCO$_3$ and CuO each having an average particle diameter of 3 μm were mixed at a molar ratio of 1 : 2 : 1 : 2. Water was added to the mixture, and they were calcinated at 800° C. for 10 hours in air. The calcinated product was ground with ZrO$_2$ boulders in ethanol for 15 hours to obtain a superconducting sintered powder whose main crystal phase had a composition of Bi$_2$Sr$_2$CaCu$_2$O$_x$. To this poweder were added 15 g of toluene and 0.2 g of polyvinyl butyral to prepare a slurry. This slurry was spray-coated on the above second intermediate layer (Ag layer). Drying was effected at 80° C. for 1 hour. Then, the spray coating and drying was repeated four times to form a film of about 300 μm on the Ag layer.

The thus obtained laminate comprising a metal substrate, two intermediate layers formed thereon and a superconducting calcinated powder layer formed on the second intermediate layer was dried at 100° C. for 1 hour and then fired at 910° C. for 10 minutes in an electric furnace to obtain a Bi-based oxide superconducting laminate.

A test piece was cut out from the laminate and measured for critical current density (Jc) in liquid nitrogen according to a DC four-probe method. The Jc was 865 A/cm$^2$.

Another test piece was subjected to a repeated procedure of immersion (cooling) in liquid nitrogen and returning to room temperature. Both the oxide superconducting layer and the intermediate layer of the laminate caused no crack or peeling, and the laminate had good adhesion.

EXAMPLE 40

A PSZ powder was plasma-sprayed on a plate-like SUS 430 stainless steel substrate of 100 mm×100 mm×1.0 mm in the same manner as in Example 39 to form a PSZ intermediate layer on the substrate. On this intermediate layer was sprinkled a silver carbonate powder, and a heat treatment of 850° C. for 30 minutes was applied to form, as a second intermediate layer, a Ag layer of 25 μm in thickness on the PSZ intermediate layer (first intermediate layer). Then, powders of Bi$_2$O$_3$, SrCO$_3$, CaCO$_3$ and CuO each having an average particle diameter of 3 μm were mixed at a molar ratio of 1 : 2 : 1 : 2. To 100 g of the mixed powder were added 20 g of distrilled water and 0.2 g of polyvinyl alcohol to prepare a slurry. This slurry was spray-coated on the above second intermediate layer (Ag layer), and drying was effected at 100° C. for 30 minutes. Then, the spray coating and drying was repeated 7 times to form a film of about 600 μm on the second Ag intermediate layer.

The resulting article comprising a substrate, two intermediate layers formed thereon and a superconducting calcinated powder layer formed on the second intermediate layer was dried at 100° C. for 1 hour and then fired at a maximum temperature of 900° C. for 10 minutes in an electric furnace to obtain a Bi-based oxide superconducting laminate.

The laminate was measured for Jc in the same manner as in Example 39. The Jc was 720 A/cm$^2$.

EXAMPLE 41

A spinel powder was plasma-sprayed on a plate-like SUS 430 stainless steel substrate of 100 mm×100 mm×1.0 mm in the same manner as in Example 39 to form a spinel layer of 300 μm in thickness. Onto this spinel layer was press-bonded a Au foil of 30 μm in thickness with heating to form a Au layer. A Bi-based superconducting powder of Bi : Sr : Ca : Cu=2 : 2 : 1 : 2 was molded into a tape shape by a doctor blade method. This green tape was placed on the above Au layer, and firing was effecte at 920° C. for 10 minutes to obtain a Bi-based oxide superconducting laminate.

The laminate was measured for Jc in the same manner as in Example 39. The Jc was 820 A/cm$^2$.

EXAMPLES 42–47

A PSZ powder was plasma-sprayed on a plate-like SUS 430 stainless steel substrate of 100 mm×100 mm×1.0 mm in the same manner as in Example 39 to form a PSZ layer of 200 μm as a first intermediate layer.

Then, on the PSZ layer was formed a Ag layer as a second intermediate layer according to a plating method or a thermal press-bonding method. On the second intermediate layer was formed a Bi-based superconducting layer in the same manner as in Example 39, whereby six oxide superconducting laminates were obtained. The constitution and critical current density at 77 K of each oxide superconducting laminate are shown in Table 9. As is clear from Table 9, each laminate showed good superconducting properties.

COMPARATIVE EXAMPLES 10-13

A PSZ powder was plasma-sprayed on a plate-like SUS 430 stainless steel substrate of 100 mm×100 mm×1.0 mm in the same manner as in Example 39 to form a PSZ first intermediate layer of 200 μm.

On this PSZ layer was formed a Ag second intermediate layer by plating in the same manner as in Examples 42-47. The thickness of the Ag layer was 0, 1, 5 or 8 μm. On the Ag layer was formed a Bi-based superconducting layer in the same manner as in Example 39, whereby four oxide superconducting laminates were obtained.

The constitution and critical current density at 77 K of each laminate are shown in Table 9. As is clear from Table 9, none of the laminates showed good superconducting properties.

The laminates obtained in Examples 42-47 and Comparative Examples 10-13 were subjected to a thermal cycle test. This test was conducted by immersing a laminate of room temperature (20° C.) in liquid nitrogen for 10 minutes, taking it out and leaving at room temperature, repeating this cycle 5 times and examining the occurrence of peeling.

The results are shown in Table 9. As is clear from Table 9, peeling occurred in Comparative Examples 10-13 wherein the Ag intermediate layer had a thickness of 8 μm or less, while no peeling occurred in all of Examples 42-47.

partially melted at 890° C. for 30 minutes in an oxygen atmosphere, then annealed to 850° C. at a rate of 0.5° C./min, and allowed to stand at 850° C. for 15 hours to give rise to crystallization. Thereafter, the resulting article was heat-treated at 400° C. for 20 hours in a nitrogen atmosphere.

The thus obtained cylinder was measured for magnetic shieldability using an apparatus for measurement of magnetic shieldability, shown in FIG. 3. In FIG. 3, the above cylinder 11 was placed in a container 10 for liquid nitrogen; the container 10 was filled with liquid nitrogen; an external magnetic field was applied from an electromagnet 12; using a Gauss meter 13 placed in the cylinder 11, there was measured a maximum external magnetic field (magnetic shieldability) at which the magnetic field in the cylinder began to exceed the background. The magnetic shieldability was 10 G.

The cylinder was observed after the measurement of magnetic shieldability, but there was no defects such as crack, peeling and the like.

What is claimed is:

1. A superconducting structure for magnetic shielding, which comprises:
    a superconducting layer having a thickness of 0.1-2 mm;
    a substrate consisting of a metal material;
    an intermediate layer consisting of a ceramic material or a glass material between the superconducting layer and the substrate; and

TABLE 9

| | | Second intermediate layer | | Critical current density (A/cm$^2$) (77K) | Results of thermal cycle test |
|---|---|---|---|---|---|
| | Material | Thickness (μm) | Method of formation | | |
| EXAMPLES | | | | | |
| 42 | Ag | 12 | Plating | 755 | No peeling |
| 43 | Ag | 23 | Plating | 822 | No peeling |
| 44 | Ag | 52 | Plating | 864 | No peeling |
| 45 | Ag | 50 | Press bonding of foil with heating | 830 | No peeling |
| 46 | Ag | 100 | Press bonding of foil with heating | 938 | No peeling |
| 47 | Ag | 200 | Press bonding of foil with heating | 894 | No peeling |
| COMPARATIVE EXAMPLES | | | | | |
| 10 | — | 0 | — | 49 | Peeling between metal substrate and first intermediate layer |
| 11 | Ag | 1 | Plating | 260 | Peeling between metal substrate and first intermediate layer |
| 12 | Ag | 5 | Plating | 544 | Peeling between metal substrate and first intermediate layer |
| 13 | Ag | 8 | Plating | 711 | Peeling between first and second intermediate layers |

EXAMPLE 48

On the outer surface of a cylindrical substrate made of incoloy 825 and having a diameter of 50 mm, a height of 150 mm and a thickness of 1 mm was spray-coated, at a thickness of 100 μm, a slurry obtained by dissolving a glass powder for porcelain enamel (45 wt. % of SiO$_2$, 20 wt. % of TiO$_2$, 15 wt. % of B$_2$O$_3$, 10 wdt. % of Na$_2$O, 5 wt. % of NiO, 2.5 wt. % of K$_2$O, 2.5 wt. % of CuO) in isopropyl alcohol. Thereon was press-bonded a Ag foil of 100 μm in thickness, and the resulting article was fired at 900° C. for 1 hour in the atmosphere to joint the substrate, the glass powder and the Ag foil.

On the Ag foil was spray-coated, at a thickness of 500 μm, a slurry obtained by dissolving a Bi$_2$Sr$_2$CaCu$_2$O$_x$ powder in isopropyl alcohol. The coated slurry was a noble metal layer between the superconducting layer and the intermediate layer.

2. A superconducting structure for magnetic shielding according to claim 1, wherein the superconducting layer has a thickness of 0.5-1 mm.

3. A superconducting structure for magnetic shielding according to claim 1, further comprising a protective layer at the side of the superconducting layer opposite to its substrate side.

4. A superconducting structure for magnetic shielding according to claim 1 or 2 wherein the superconducting layer is an oxide having a multi-layered perovskite structure of Bi-Sr-Ca-Cu-O compound.

5. A superconducting structure according to claim 3, wherein the protective layer comprises aluminum or a low-temperature resistant synthetic resin.

6. A superconducting structure for magnetic shielding according to claim 1 or 2 which has a plate-like shape.

7. A superconducting structure for magnetic shielding according to claim 6, which has a L/S ratio of 0.4 $cm^{-1}$ or less when L (cm) is defined as the total length of sides and S ($cm^2$) is defined as the area of one surface.

8. A superconducting plate for magnetic shielding, comprising at least two superconducting structures of claim 7.

9. A superconducting structure for magnetic shielding according to claim 6, wherein the superconducting layer is provided directly or indirectly on the substrate so that a portion of the substrate adjacent to its four sides, having a width of 1 mm or more is not covered by the superconducting layer.

10. A superconducting structure for magnetic shielding according to claim 1 or 2, which has a cylindrical shape with the superconducting layer positioned at the outer side so as to shield from a magnetic field emitted from an external 11. A superconducting structure for magnetic shielding according to claim 10, which has a length-to-inside diameter ratio of 1.5 or more.

12. A superconducting structure for magnetic shielding according to claim 10, wherein the superconducting layer is placed directly or indirectly on the substrate so that the portion of the substrate adjacent to each end, having a width of 5 mm or more is not covered by the superconducting layer.

13. A superconducting structure for magnetic shielding according to claim 1 or 2, which has a cylindrical shape with the superconducting layer positioned at the inner side so as to shield from a magnetic field emitted from the substrate and the intermediate layers, as well as from an external magnetic field.

14. A superconducting structure for magnetic shielding according to claim 13, which has a length-to-inside diameter ratio of 1.5 or more.

15. A superconducting layer for magnetic shielding according to claim 13, wherein the superconducting layer is placed directly or indirectly on the substrate so that the portion of the substrate adjacent to each end, having a width of 5 mm or more is not covered by the superconducting layer.

* * * * *